United States Patent [19]

Feldberg

[11] Patent Number: 4,533,199

[45] Date of Patent: Aug. 6, 1985

[54] IDC TERMINATION FOR COAXIAL CABLE

[75] Inventor: Leonard Feldberg, Spring Valley, N.Y.

[73] Assignee: Burndy Corporation, Norwalk, Conn.

[21] Appl. No.: 551,771

[22] Filed: Nov. 14, 1983

[51] Int. Cl.$^3$ ..................... H01R 11/20; H01R 43/04; H05K 3/30

[52] U.S. Cl. .................................... 339/99 R; 29/838; 29/866

[58] Field of Search ..................... 339/97 R, 97 P, 98, 339/99 R, 96, 97 C, 177 R, 177 E, 143 R, 223 R; 29/831, 832, 837-840, 857, 861, 865-867

[56] References Cited

U.S. PATENT DOCUMENTS

| | | | |
|---|---|---|---|
| 3,576,518 | 4/1971 | Bazille, Jr. et al. | 339/98 |
| 3,743,748 | 7/1973 | Reeder | 339/17 R X |
| 3,915,535 | 10/1975 | O'Keefe et al. | 339/217 R X |
| 4,261,632 | 4/1981 | Narozny | 339/97 C |

FOREIGN PATENT DOCUMENTS

| | | | |
|---|---|---|---|
| 1928485 | 12/1970 | Fed. Rep. of Germany | 339/177 R |

*Primary Examiner*—Gil Weidenfeld
*Assistant Examiner*—Steven C. Bishop
*Attorney, Agent, or Firm*—Howard S. Reiter

[57] ABSTRACT

A connector for terminating a coaxial cable is provided which includes a first insulation displacement contact for contacting the shield and a second insulation displacement contact for contacting the central conductor. The contacts are arranged on a support base in an axial sense corresponding to the axis of the cable defined by the central conductor. The process of terminating the coaxial cable comprises stripping the outer insulating jacket and shield from a small end portion of the cable and then inserting that portion into one of the contacts while an unstripped portion is inserted into the other of the contacts. The insulation displacement contacts pierce the insulation to make direct electrical contact to the respective shield or central conductor.

6 Claims, 5 Drawing Figures

FIG. 2.
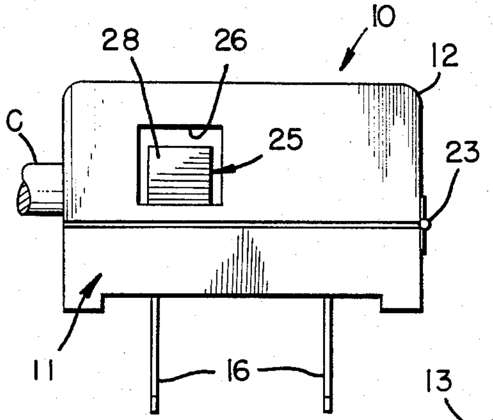
FIG. 1.
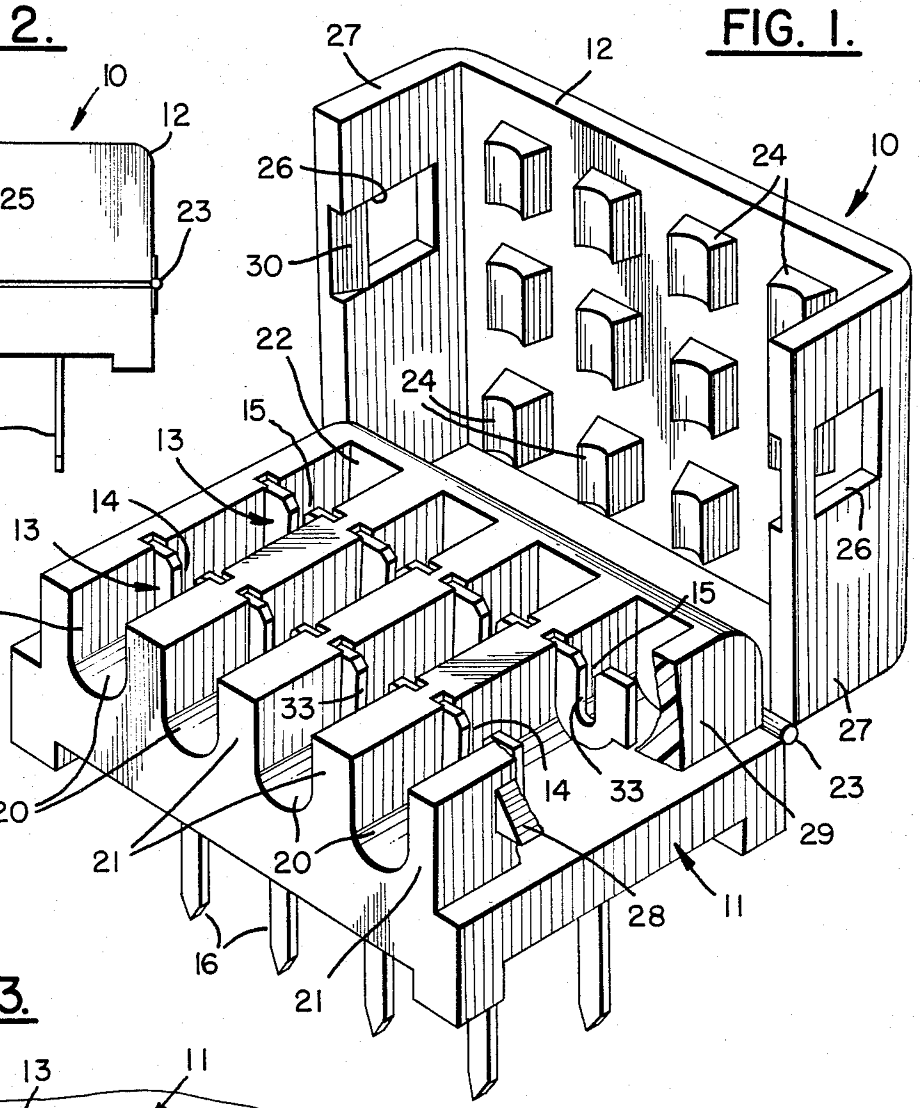
FIG. 3.
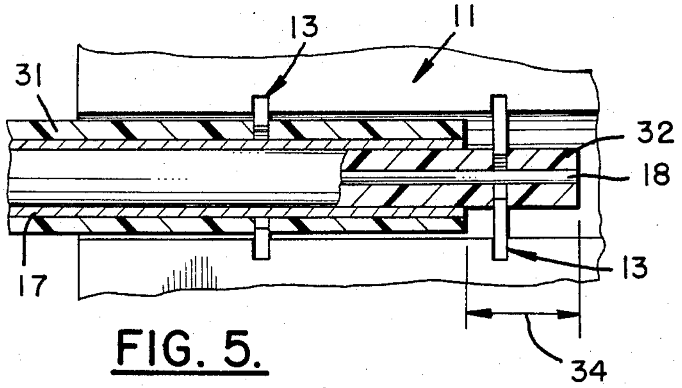
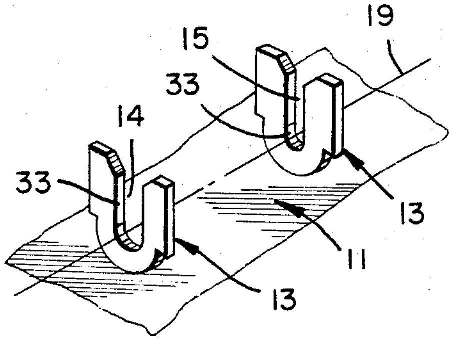
FIG. 4.
FIG. 5.
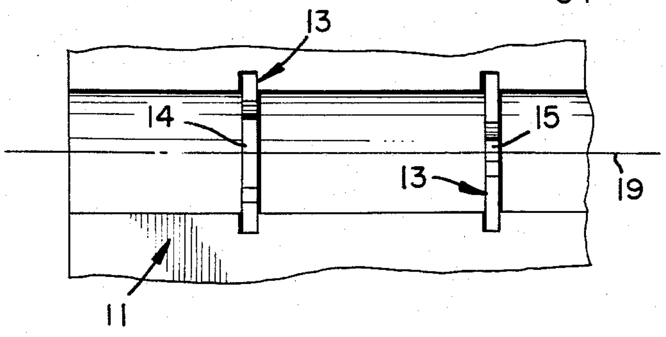

IDC TERMINATION FOR COAXIAL CABLE

BACKGROUND OF THE INVENTION

This invention relates to an electrical connector for terminating a coaxial cable and, more particularly, to a coaxial cable connector for use on a printed circuit board.

Reference is hereby made to two copending patent applications by H. Blackwood assigned to the same assignee as this application; "IDC Termination For Coaxial Cable Having Alignment and Stabilizing Means" Ser. No. 553,833, filed on Nov. 21, 1983, and "IDC Termination Having Means To Adapt To Various Connector Sizes", Ser. No. 553,906, filed on Nov. 21, 1983. These cross-referenced applications are incorporated herein by reference in their entirety.

Coaxial cables can comprise a single strand cable or a ribbon-type cable. In a coaxial cable, the central conductor is shielded from outside interference by a surrounding conductor which is spaced therefrom. An insulating layer separates the surrounding shield and the central conductor. An insulating jacket, in turn, surrounds the shield. The shield may be braided metallic wire or foil, etc. When the shield comprises a foil, it is known to utilize a drain wire in contact therewith for terminating the foil shielding.

Ribbon-type coaxial cables including a plurality of individual cable elements with a common outer insulating jacket are also known. As for example, the ribbon coaxial cables described in U.S. Pat. Nos. 3,963,319, to Schumacher and 4,035,050 to Volinskie. These patents also disclose electrical connectors for terminating the ribbon-type cable to a printed circuit board. The cables described in these patents employ a center conductor and drain wire lying parallel to one another. The electrical contacts of the connector are connected to the respective conductors and the wires are laterally displaced from one another. The result is an electrical connector assembly of substantial width since the contacts of the connector are spaced laterally for connection to parallel drain and central conductors.

Ordinary coaxial cable generally employs a braided shield. With respect to such cables, considerable difficulty and time is consumed in assemblying them to circuit boards. Further, the manner in which the cables must be stripped to reveal the shield and conductor can result in a mismatch of impedance.

In accordance with the prior art approach, the insulation around the braid is cut quite far back. The braid is then combed out and cut back somewhat less than the outer insulating jacket to expose the insulation around the conductor. The insulation around the conductor is then cut back about midway between the end of the braid and the end of the conductor to expose the conductor. The conductor is terminated to the circuit board and the braid is "pig-tailed" and then joined to the circuit board.

Several problems exist in this prior art approach. The braid and the center conductor can be nipped during stripping thereby deteriorating the performance of the cable. Also, since the braid is cut back more than the central conductor, there is an impedance mis-match and this can produce a distorted signal. Obviously, the prior art process being a multiple step manual one is extremely time consuming and slow.

Electrical connectors employing insulation displacement contacts are well known in the art and are commercially available from companies such as Burndy Corporation, Norwalk, Conn. By using insulation displacement contacts (IDCs), it is unnecessary to strip the insulation from the wire to be contacted. The contact has a blade-like configuration with a slot having a width corresponding to the diameter of the electrical conductor. When the insulated wire is pressed into the slot, the edges of the slot displace the insulation to allow intimate electrical contact between the conductor and the slot edges. The use of such insulation displacement contacts in a wide variety of electrical connectors is illustrated by reference to U.S. Pat. Nos. 3,112,147, 3,118,715, 3,434,093, 3,617,983, 3,772,635, 3,835,444, 3,836,944, 3,842,392, and 3,848,951. In some of the connectors illustrated in these patents, the insulation displacement contact includes two contact slots in axial alignment which are electrically connected to provide a redundant contact to the conductor.

SUMMARY OF THE INVENTION

In accordance with this invention, an electrical connector is provided for a coaxial cable. The cable comprises at least one central conductor defining a cable axis; at least one surrounding conductive shield element; an insulating layer arranged between the shield and the conductor; and an outer insulating jacket arranged about the shield. The connector comprises a first insulation displacement contact means for electrically contacting the shield by displacement of the insulating jacket; a second insulation displacement contact means for electrically contacting the central conductor by displacement of the insulating layer, and a terminal support means comprising a base member for supporting the first and second contact means. The contact means is arranged on the base member along a contact axis with the second contact means following the first contact means and being electrically insulated therefrom. The electrical connector thus described requires that the braid and the outer jacket be cut back more than the central conductor. However, the amount of the cut-back, is relatively small, such as in the order of approximately ⅛th of an inch, and is much less than in the prior art approach. As a result, the extent of impedance mis-match is minimized. Further, only one cut in the outer insulation and braid is required before installation of the connector, and it is not necessary to comb or "pig-tail" the braid before attaching the connector. Conventional coaxial cable stripping tools can easily perform the one cut-back operation.

Preferably, the first contact means comprises a contact with a first slot having a first width and a second contact means comprises a contact having a second slot with a second width narrower than the first width. The contacts themselves can include pin portions for insertion and connection to a printed circuit board. A cover member preferably snap locks onto the base to lock the coaxial cable in place. Preferably, the cover member is integrally hinged to the base and includes anvil portions for pushing the cable into the contact slots as the cover member is closed.

The coaxial cable connector of this invention can be used for terminating a single coaxial cable or any desired number of coaxial cables.

In accordance with the process of the present invention, a coaxial cable connector is provided as described. A small portion at the end of the coaxial cable is stripped down to the insulating layer leaving an end portion of the cable including the insulating layer and central conductor and the remaining portion of the cable further including the shield and outer jacket. The stripped cable is than inserted in the connector by forcing the end portion of the cable into the second contact slot and an unstripped portion of the cable into the first contact slot. Each of the respective contacts displaces the insulation to make intimate electrical connection to the respective shield or central conductor. When the cable is connected to the terminal, the terminal axis corresponds to a cable axis defined by the central conductor.

Accordingly it is an object of this invention to provide an improved electrical connector for use with a coaxial cable.

It is a further object of this invention to provide a connector as above which can be used as a coaxial cable termination on a circuit board.

It is a still further object of this invention to provide a process for connecting an electrical connector as above to a coaxial cable.

These and other objects will become more apparent from the following description and drawings.

BRIEF DESCRIPTION OF THE DRAWINGS

FIG. 1 is a perspective view of an electrical connector for coaxial cable in accordance with one embodiment of this invention.

FIG. 2 is a side view of the electrical connector in FIG. 1.

FIG. 3 is a partial top view showing a coaxial cable cross-section inserted in a set of electrical contacts of the electrical connector as in FIG. 1.

FIG. 4 is a partial perspective view showing a set of electrical contacts arranged in the base support.

FIG. 5 is a top view of the electrical contact arrangement of FIG. 4.

DETAILED DESCRIPTION OF THE PREFERRED EMBODIMENTS

Referring now to FIGS. 1–5, an electrical connector 10 is shown in accordance with the preferred embodiment of this invention. The connector 10 comprises a base member 11, a hinged cover member 12 and a plurality of electrical contacts 13. The electrical contacts 13 comprise insulation displacement contacts. Each contact 13 includes a slot 14 or 15 and pin portions 16. The pin portions 16 are adapted for insertion in respective contact holes of a printed circuit board. Each contact 13 comprises an integral metal member and is arranged in the base member so that it is electrically isolated or insulated from each of the other contacts 13. The slot 14 is relatively wider than the slot 15.

The electrical contacts 13 with the wider slots 14 are adapted to contact the shields 17 of the coaxial cable C. The electrical contacts 13 with the narrow slots 15 are adapted to contact the central conductor 18 of the coaxial cable C. Each coaxial cable C requires a set of contacts 13 comprising a first contact having a slot 14 and a second contact having a slot 15. The first and second contacts 13 are arranged along a contact axis 19, as shown in FIGS. 4 and 5, with a second contact having the slot 15 being arranged following the first contact 13 having the slot 14. When the cable C is connected to the contacts 13, the contact axis corresponds to the cable axis defined by the central conductor 18. The contact axis 19 runs centrally of the slots 14 and 15.

In the embodiment shown in FIG. 1, portion of the contacts 13, including the slots 14 or 15, are arranged within slots 20 of base member 11. Each of the slots 20 is adapted to receive a coaxial cable C. The slots 20 are defined by side walls 21 and end walls 22. A portion of the first side wall 21 has been cut away to reveal the contacts 13.

In the connector shown in FIG. 1, there are four slots 20, each including a set of contacts 13. This electrical connector is adapted to terminate four coaxial cables. Electrical connectors in accordance with this invention can be fabricated to terminate one coaxial cable or, in the alternative, any desired number of coaxial cables merely by providing the desired numbers of contact 13 sets.

The cover member 12 is hinged to the base member 11 by an integral hinge portion 23. In practice, the cover member 12, base member 11 and integral hinge 23 are formed by molding as a single piece. Cover member 12 can include a plurality of anvil portions 24 arranged to fit within the slots 20. The anvil portions 24 serve to push the coaxial cable C into the slots 20 so as to make electrical connection to the contacts 13. They also serve to clamp the cable in place to prevent it from pulling the connector 10.

When the cover 12 is closed as in FIG. 2, it is locked in place by means of a latch mechanism 25. The latch mechanism 25 is comprised of windows 26 in the side walls 27 of the cover member 12. Corresponding latching projections 28 extend outwardly from the side walls 29 of the base member 11. An inclined lip portion 30 is arranged at the bottom inside of each of the windows 26. When the cover member 12 is pivoted to the closed position, as shown in FIG. 2, the latching projections 28 engage the inclined lip portions 30 to spread apart the side walls 27 of the cover member until the cover is fully closed. At this time, the projections 28 seat within the windows 26 so that the side walls 27 spring back to their original shapes thereby locking the cover member 12 to the base member 11.

The electrical contacts 13 are formed of a high strength, high conductivity metal such as a copper base alloy. The contacts 13 are relatively thin so that they have a blade-like effect. When the coaxial cable C is inserted into the electrical connector 10 of this invention, the outer insulating jacket 31 and the insulating layer 32 are pierced or displaced by the edges 33 defining the slots 14 or 15 in the contacts 13. These edges then are in intimate electrical contact with the shield 17 or central conductor 18.

The process of the present invention comprises providing an electrical connector 10 which includes one or more sets of contacts 13. A portion 34 of the coaxial cable C is stripped of the outer jacket 31 and shield 17 so that the insulating layer 32 is bared. The length of the portion 34 may be relatively short, such as, for example, approximately ⅛th of an inch. The cable is then inserted in the slot 20 of the connector 10 so that the portion 34 is pressed into the slot 15 of the contact 13 while an unstripped portion of the cable C is pressed into the slot 14 of a contact 13. The cable may be placed into the slot 20 by pressing, such as by a machine or by hand, or by the action of the anvils 24 of the cover member 12 as it is pivoted into its locked position.

If the coaxial cable C comprises a ribbon-type cable including a plurality of coaxial cable elements, electrical connector 10 can be used with minor modification. The modification would comprise eliminating the intermediate side walls 21 lying between the outside side walls. While connector 10 shows only one contact 13 being used to connect to the portion 34, or the unstripped portion, of the cable, it is within the scope of this invention to employ redundant contacts electrically interconnected in place of the single contact shown for each of the contact sets.

The patents described in the background of the invention herein are intended to be incorporated in their entirety by reference herein.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A connector for a coaxial cable, said cable comprising: at least one central conductor defining a cable axis; at least one surrounding conductive shield element; a first insulating layer arranged between said shield element and said central conductor; and an outer insulating jacket arranged about said shield element; said connector comprising:

first insulation displacement contact means for electrically contacting said shield element by displacement of said insulating jacket;

second insulation displacement contact means for electrically contacting said central conductor by displacement of said insulating layer;

said first contact means comprising a member including a first slot having a first width and wherein said second contact means comprises a member having a second slot having a second width narrower than said first width and wherein said slots are arranged along said contact axis whereby said cable is adapted to be pressed into said slots;

said first and second contact means having blade metal members including pin-positions for connection to a printed circuit board;

contact support means comprising a base member for supporting said first and second contact means, said contact means being arranged on said base member along a contact axis with said second contact means following said first contact means and being electrically isolated therefrom, whereby when said cable is connected to said first and second contact means said contact axis corresponds to said cable axis; and a cover member and means for locking said cover member to said base member, the cover member being hinged to said base member to pivot between an open position for inserting said coaxial cable and a closed portion for locking said coaxial cable in place and wherein said cover member includes anvil portions for engaging said cable when said cover member is closed.

2. A connector as in claim 1 wherein said first contact means and said second contact means comprise a contact set for a coaxial cable and wherein said connector includes a plurality of said contacts.

3. A connector as in claim 2 wherein said base member includes a slot for receiving said coaxial cable and wherein said contact set is arranged within said slot.

4. A process for terminating a coaxial cable, using the electrical connector as defined in claim 1, said cable comprising: at least one central conductor defining a cable axis; at least one surrounding conductive shield element; a first insulating layer arranged between said shield element and said conductor; and an outer insulating jacket arranged about said shield element; said process comprising:

providing said electrical connector stripping away a short portion of said outer insulating jacket and said shield element from an end portion of said coaxial cable;

inserting said end portion of said coaxial cable into said second insulation displacement contact means so that said said insulating layer is displaced and said second insulation displacement contact means is in intimate electrical contact with said central conductor; and inserting an unstripped portion of said cable into said first insulation displacement contact means so that said insulating jacket is displaced by said first insulation displacement contact means to make intimate electrical contact with said shield element.

5. A process as in claim 4 further including the step of locking said coaxial cable into contact with first and second insulation displacement contact means.

6. A process as in claim 5 further including the step of connecting said electrical connector to a printed circuit board.

* * * * *